US012642092B2

(12) United States Patent
Refai-Ahmed et al.

(10) Patent No.: US 12,642,092 B2
(45) Date of Patent: May 26, 2026

(54) CHIP PACKAGE WITH DECOUPLED THERMAL MANAGEMENT

(71) Applicant: XILINX, INC., San Jose, CA (US)

(72) Inventors: Gamal Refai-Ahmed, Santa Clara, CA (US); Yohan Frans, Palo Alto, CA (US); Suresh Ramalingam, Fremont, CA (US)

(73) Assignee: XILINX, INC., San Jose, CA (US)

( * ) Notice: Subject to any disclaimer, the term of this patent is extended or adjusted under 35 U.S.C. 154(b) by 800 days.

(21) Appl. No.: 17/688,803

(22) Filed: Mar. 7, 2022

(65) Prior Publication Data

US 2023/0282547 A1 Sep. 7, 2023

(51) Int. Cl.
| | |
|---|---|
| *H10W 40/73* | (2026.01) |
| *H10W 40/00* | (2026.01) |
| *H10W 42/00* | (2026.01) |
| *H10W 76/40* | (2026.01) |
| *H10W 90/00* | (2026.01) |

(52) U.S. Cl.
CPC ......... *H10W 40/73* (2026.01); *H10W 40/037* (2026.01); *H10W 42/121* (2026.01); *H10W 76/40* (2026.01); *H10W 90/00* (2026.01)

(58) Field of Classification Search
CPC ....... H01L 2023/405; H01L 2023/4056; H01L 2023/4068; H01L 2023/4081; H01L 21/4882
USPC ....................................................... 257/715
See application file for complete search history.

(56) References Cited

U.S. PATENT DOCUMENTS

| | | | | |
|---|---|---|---|---|
| 9,883,612 B2 * | 1/2018 | Achard | ................. | H01L 23/367 |
| 10,147,664 B2 | 12/2018 | Refai-Ahmed et al. | | |
| 11,246,211 B1 | 2/2022 | Refai-Ahmed et al. | | |
| 2013/0112387 A1 * | 5/2013 | Qin | .................... | H05K 7/20418 165/185 |
| 2017/0299281 A1 * | 10/2017 | Bodenweber | ....... | H01L 23/3672 |
| 2021/0125898 A1 * | 4/2021 | Torresin | .................... | F28F 1/26 |
| 2021/0305127 A1 | 9/2021 | Refai-Ahmed et al. | | |
| 2021/0407877 A1 * | 12/2021 | Eid | ........................ | H01L 23/562 |
| 2021/0407879 A1 * | 12/2021 | Patel | .................. | H01L 23/3672 |
| 2024/0371721 A1 * | 11/2024 | Fu | ........................... | H01L 23/42 |

OTHER PUBLICATIONS

U.S. Appl. No. 17/133,525, filed Dec. 23, 2020 Entitled "Force Balanced Package Mounting".
U.S. Appl. No. 17/133,518, filed Dec. 23, 2020 Entitled "Radome With Integrated Passive Cooling".
U.S. Appl. No. 16/780,305, filed Feb. 3, 2020 Entitled "Thermal Heat Spreader Plate for Electronic Device".

* cited by examiner

*Primary Examiner* — Ori Nadav
(74) *Attorney, Agent, or Firm* — Patterson + Sheridan, LLP

(57) ABSTRACT

Chip packages and methods for fabricating the same are provided which utilize a first heat spreader interfaced with a first integrated circuit (IC) die and a second heat spreader separately interfaced with a second IC die. The separate heat spreaders allow the force applied to the first IC die to be controlled independent of the force applied to the second IC die.

16 Claims, 12 Drawing Sheets

CHIP PACKAGE WITH DECOUPLED THERMAL MANAGEMENT

TECHNICAL FIELD

Embodiments of the present invention generally relate to a chip package, and in particular, to a chip package comprising at least a first integrated circuit (IC) die and a second IC die disposed on a package substrate or interposer, separate heat spreaders interfaced with the IC dies.

BACKGROUND

Electronic devices, such as tablets, computers, copiers, digital cameras, smart phones, control systems and automated teller machines, among others, often employ electronic components which leverage chip packages for increased functionality and higher component density. Conventional chip packaging schemes often utilize a package substrate, often in conjunction with a through-silicon-via (TSV) interposer, to enable a plurality of integrated circuit (IC) dies to be mounted to a single package substrate. The IC dies may include memory, logic or other IC devices.

In many chip packages, providing adequate thermal management has become increasingly challenging. Failure to provide adequate cooling often results in diminished service life and even device failure. Thermal management is particularly problematic in applications where multiple IC dies are laterally disposed on a substrate in a single chip package, and where each of the first and second IC dies have different limits to the amount of force that can be applied each die. In such situations, the force applied to both of the two IC dies is generally the lesser of the limiting forces, which results in either poor electrical connections or poor heat transfer out from at least one of the IC dies.

Therefore, a need exists for a chip package having improved thermal management.

SUMMARY

Chip packages and methods for fabricating the same are provided which utilize a first heat spreader interfaced with a first integrated circuit (IC) die and a second heat spreader separately interfaced with a second IC die. The separate heat spreaders allow the force applied to the first IC die to be controlled independent of the force applied to the second IC die.

In one example, an electronic device is provided that includes a package substrate, a stiffener, at least first and second IC dies, first and second heat spreaders, and a flexible heater pipe. The stiffener is mounted to the package substrate. The first IC die has a first surface and a second surface facing away from the first surface. The second surface of the first IC die face the package substrate. The second IC die has a first surface and a second surface. The second surface of the second IC die faces the package substrate. The first heat spreader has a first surface and a second surface. The first surface of the first heat spreader has a die contact region configured for contacting the first surface of the first IC die. The first heat spreader has an opening in which the second heat spreader is movably disposed. The second heat spreader has a first surface and a second surface. The second heat spreader is spaced from the first heat spreader by a gap defining a portion of the opening. The flexible heat pipe is in thermal contact with the second heat spreader and is movable with the second heat spreader relative to the first heat spreader.

In yet another example, an electronic device is provided that includes a package substrate, a stiffener, at least first and second IC dies, and first and second heat spreaders. The stiffener is mounted to a perimeter of the package substrate and has a first notch. The first IC die has a first surface and a second surface facing away from the first surface. The second surface of the first IC die is mechanically and electrically coupled to the package substrate inward of the stiffener. The second IC die has a first surface and a second surface. The second surface of the first IC die is mechanically and electrically coupled to the package substrate in the first notch of the stiffener. The first heat spreader has a first surface and a second surface. The first surface of the first heat spreader has a die contact region configured for contacting the first surface of the first IC die. The second heat spreader has a first surface and a second surface. The second heat spreader is movably disposed over the first notch of the stiffener. The second heat spreader is configured to apply a force on the second IC die independently controllable from a force applied on the first IC die by the first heat spreader.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

Chip packages and methods for fabricating the same are provided which utilize a first heat spreader interfaced with a first integrated circuit (IC) die and a second heat spreader separately interfaced with a second IC die. The separate heat spreaders allow the force applied to the first IC die to be controlled independent of the force applied to the second IC die. Since the force applied to each of the first and second IC dies is set independent of the other, good electrical contacts and robust thermal management of the IC dies within the chip package is realized. This is particularly advantageous when two IC dies within the package have different maximum safe force loads that can be applied to each die. Some examples described herein also leverage intra-package sockets to allow one IC die to be connected within the package after reflow connection of another IC die within the chip package, thus allowing IC dies having low heat tolerance to be reliably utilized in the chip package. Accordingly, chip packages fabricated in accordance with the techniques described herein have longer service life, improved reliability and excellent performance.

Figure 1:
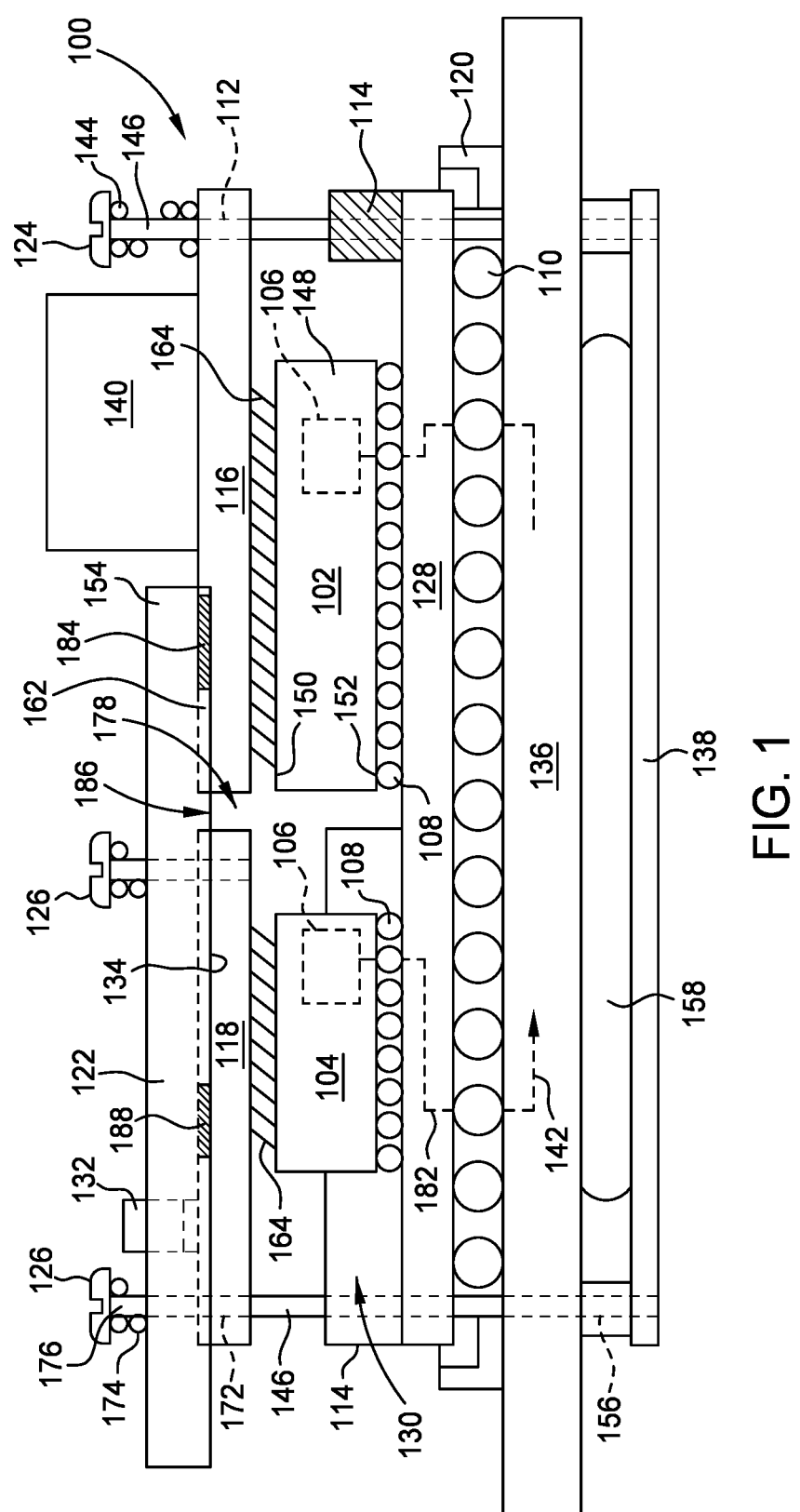
FIG. 1 is a schematic sectional view of a chip package having a first heat spreader interfaced with a first integrated circuit (IC) die and a second heat spreader separately interfaced with a second IC die, the IC dies mounted on a package substrate.

Turning now to FIG. 1, a schematic sectional view of a chip package 100 is illustrated. The chip package 100 includes a first integrated circuit (IC) die 102, a second IC die 104, a stiffener 114, a first heat spreader 116, a second heat spreader 118, and a package substrate 128. The IC dies 102, 104 are mounted to the package substrate 128. Optionally, one or more additional IC dies may be mounted to the package substrate 128 and/or stacked on one of the IC dies 102, 104. The stiffener 114 is also mounted to a perimeter of the package substrate 128 to help the package substrate 128, and thus the chip package 100, resist warpage. The package substrate 128 of the chip package 100 may be mounted on a printed circuit board (PCB) 136 to form an electronic device 180. In the example depicted in FIG. 1, the chip package 100 is interfaced with a socket 120 disposed on the PCB 136. The chip package 100 and socket 120 have complimentary electrical contacts that allow ground, power and data signals to be transferred therebetween. Alternatively, the chip package 100 may be mounted directly on the PCB 136 using solder balls 110.

Figure 1A:
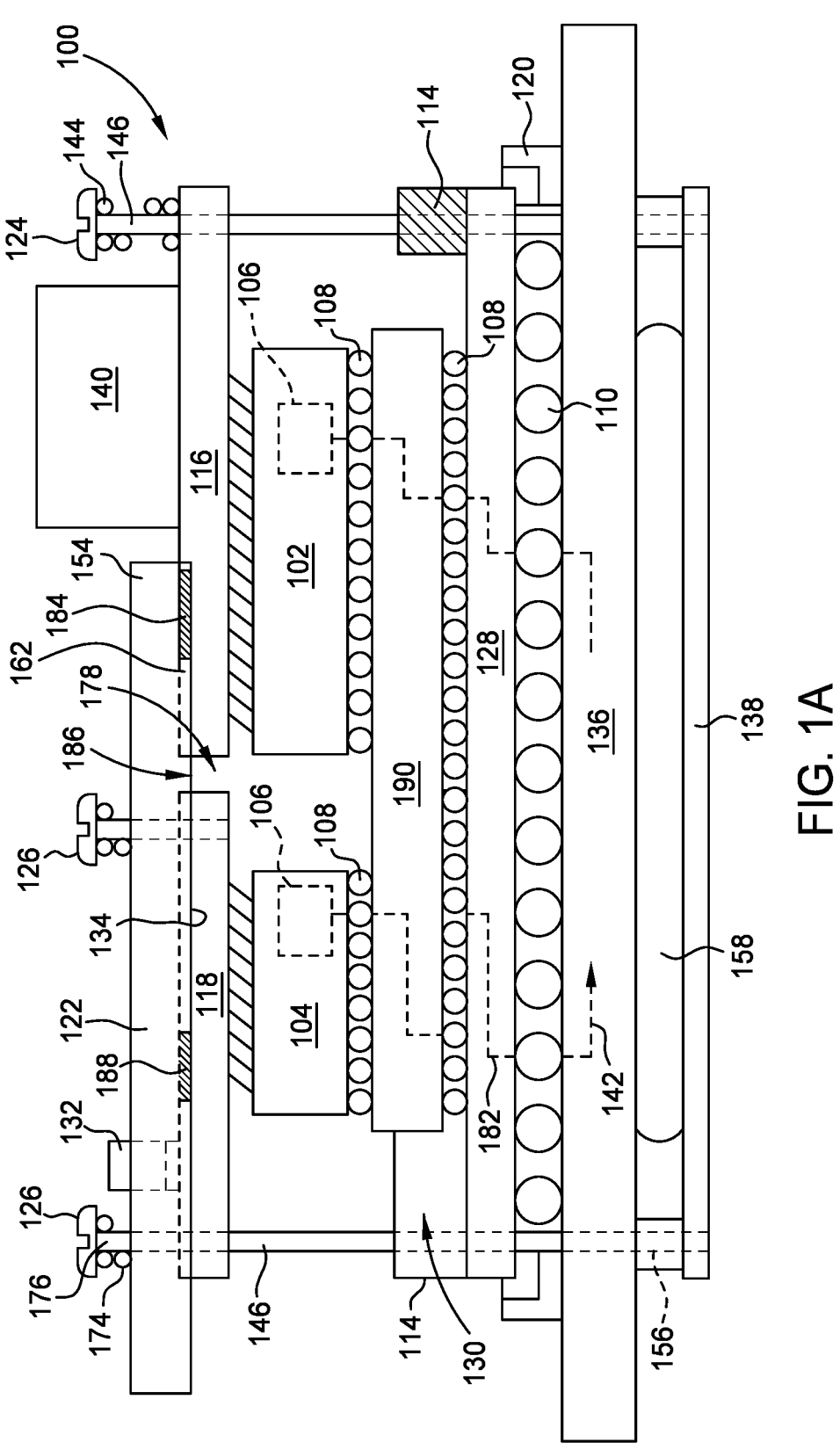
FIG. 1A is a schematic sectional view of another chip package having a first heat spreader interfaced with a first integrated circuit (IC) die and a second heat spreader separately interfaced with a second IC die, the IC dies mounted on an interposer.

Optionally, the chip package 100 may include an interposer 190 disposed between one or more of the IC dies 102, 104 and the package substrate 128, as illustrated in FIG. 1A. Except for the interposer 190, the chip package 100 illustrated in FIG. 1A is constructed essentially the same as the chip package 100 illustrated in FIG. 1. Although the interposer 190 illustrated in FIG. 1A is shown as a silicon though via interposer, the interposer 190 may be configured as an organic or inorganic interposer, a redistribution layer, a fan-out layer or other structure dispose between the package substrate 128 and IC die suitable for transmitting signals therebetween.

Returning to FIG. 1, the first IC die 102 of the chip package 100 includes functional circuitry 106. The second IC die 104 of the chip package 100 also includes its own functional circuitry 106. The includes functional circuitry 106 of the second IC die 104 may be the same as, or different than the functional circuitry 106 of the second IC die 104. The functional circuitry 106 of the first IC die 102 (and optionally, the second IC die 104) may include block random access memory (BRAM), UltraRAM (URAM), digital signal processing (DSP) blocks, configurable logic elements (CLEs), and the like. The first IC die 102 may be, but is not limited to, programmable logic devices, such as field programmable gate arrays (FPGA), memory devices, such as high band-width memory (HBM), optical devices, processors or other IC logic structures. The first IC die 102 may optionally include optical devices such as photo-detectors, lasers, optical sources, and the like. In the example of FIG. 1, the first IC die 102 is a logic die having math processor (also known as math engine) circuitry for accelerating machine-learning math operations in hardware, such as self-driving cars, artificial intelligence and data-center neural-network applications. In one or more examples, the first IC die 102 is a logic die while the second IC die 104 is a photonics die.

Optionally, the first IC die 102 may be one of a plurality of first IC dies 102. When a plurality of first IC dies 102 are utilized, the IC dies 102 may be disposed in a vertical stack and/or disposed laterally side by side. It is contemplated that the IC dies 102 comprising the plurality of IC dies 102 may be the same or different type of functionality. Although only one first IC die 102 is shown in FIG. 1, the number of first IC dies 102 disposed in the chip package 100 may vary from one to as many as can fit within the chip package 100. Additionally, one or more of the IC dies 102, 104 may optionally be configured as a chiplet. Furthermore, more than one second IC die 104 may be utilized.

The first IC die 102 includes a die body 148 having a die bottom surface 152 and a die top surface 150. The functional circuitry 106 is disposed within the die body 148 and includes routing that terminates on the die bottom surface 152 of the first IC die 102, for example at contact pads, upon which interconnects 108 are utilized to connect the functional circuitry 106 to the package circuitry 182 of the package substrate 128. In the example depicted in FIG. 1, the functional circuitry 106 of the first IC die 102 is electrically and mechanically coupled to the package circuitry 182 formed in the package substrate 128 by interconnects 108. In one example, the interconnects 108 are solder connections, such as solder bumps. The interconnects 108 may alternatively be formed by a hybrid bond layer or other suitable technique. Also depicted in the example of FIG. 1, the package circuitry 182 formed in the package substrate 128 is electrically and mechanically coupled to the circuitry 142 formed in the PCB 136 by solder balls 110. Alternatively, the package circuitry 182 formed in the package substrate 128 may be electrically and mechanically coupled to the circuitry 142 formed in the PCB 136 utilizing another suitable technique.

A thermal management device 140 may be coupled to the chip package 100 to facilitate removal of heat from the chip package 100. The thermal management device 140 may be a passive heat transfer device, such as a heat sink, heat pipe and the like; an active heat transfer device such as a heat exchanger having a heat transfer fluid flowing therethrough; or a combination of both active and passive heat transfer devices. The thermal management device 140 is disposed on the first heat spreader 116. Thermal interface material (TIM), such as a heat transfer grease, may be disposed between the thermal management device 140 and the first heat spreader 116 to promote heat transfer therebetween. Optionally, the thermal management device 140 may also be disposed on the second heat spreader 118. TIM may also be disposed in other regions of the chip package 100 as denoted by reference numeral 164. Metal contact surfaces of the thermal management device 140 may optionally be textured, such as by etching surface, microgrooves and the like, to enhance heat transfer with the TIM.

The first heat spreader 116 is disposed over the first IC die 102. The first heat spreader 116 may optionally be disposed over one or more other IC dies of the chip package 100. The first heat spreader 116 is generally fabricated from a good thermal conductor such that heat may be readily transferred from the first IC die 102 to the first heat spreader 116, and ultimately to the thermal management device 140. In this manner, the temperature of the first IC die 102 may be maintained below maximum operating temperatures, thus promoting robust performance of the first IC die 102 and the chip package 100.

As discuss above, TIM 164 may be disposed between the first IC die 102 and the first heat spreader 116 to promote heat transfer therebetween. Similarly, TIM 164 may also be disposed between the second IC die 104 and the second heat spreader 118 to promote heat transfer therebetween.

A plurality of first biasing devices 124 engage the first heat spreader 116 to urge the first heat spreader 116 against the first IC die 102, thus promoting good heat transfer therebetween. The first biasing devices 124 also urge the chip package 100 against the electrical contacts of the socket 120, thus promoting good and reliable electrical and signal transmission therebetween. In one example, each of the first biasing devices 124 include a spring 144 captured on a threaded fastener 146. The fastener 146 passes through a hole 112 formed in the first heat spreader 116, the package substrate 128 and the PCB 136. Below the PCB 136, a male threaded portion of the fastener 146 engages a female threaded hole 156 of a retainer 138. The spring 144 is captured on the threaded fastener 146 between a head of the threaded fastener 146 and the first heat spreader 116. Thus, as the fastener 146 is screwed further into the threaded hole 156 of the retainer 138, the spring 144 applies an increasingly stronger force against the first heat spreader 116, thus both urging the first heat spreader 116 against the first IC die 102, and the chip package 100 into the socket 120 of the PCB 136. Accordingly, the force applied to both the first IC die 102 by the first heat spreader 116 and to the socket 120 by the chip package 100 can be controlled by the amount that the fastener 146 is screwed into the retainer 138.

In one example, the retainer 138 is a nut. In another example, the retainer 138 is a flat plate that spans the bottom surface of the PCB 136 directly below the socket 120. In yet another example, the retainer 138 is a spring form that spans the bottom surface of the PCB 136 directly below the socket 120. Optionally, a pad 158 may be disposed between retainer 138 and the PCB 136 to directly below the socket 120 to inhibit bending of the PCB 136 as the dies 102, 104 are forced downwards towards the PCB 136.

The second heat spreader 118 is disposed over the second IC die 104. The second heat spreader 118 may optionally be disposed under the first heat spreader 116 (as later described with reference to FIG. 7). In the example depicted in FIG. 1, the second heat spreader 118 is disposed in an opening 130 formed in the first heat spreader 116. The opening 130 formed in the first heat spreader 116 may be in the form of a notch formed in an edge of the first heat spreader 116 or a window formed through the first heat spreader 116, as later described and illustrated with reference to FIGS. 6A-6D. In some examples where one or more additional heat spreaders are utilized over one or more additional IC dies, one or more of the additional heat spreaders may be disposed in the same opening or a different opening formed in the first heat spreader 116.

Continuing to refer to FIG. 1, the second heat spreader 118 is also generally fabricated from a good thermal conductor such that heat may be readily transferred from the second IC die 104 to the second heat spreader 118, and ultimately to the thermal management device 140. In this manner, the temperature of the second IC die 104 may be maintained below maximum operating temperatures, thus promoting robust performance of the second IC die 104 and the chip package 100. TIM 164 may be disposed between the second IC die 104 and the second heat spreader 118 to promote heat transfer therebetween.

The second heat spreader 118 is configured to move independently of the first heat spreader 116. When one or more additional heat spreaders are utilized, one or more of the one or more additional heat spreaders may also be configured to move independently of the first heat spreader 116. By allowing the second heat spreader 118 to move independently of the first heat spreader 116, the force applied by the second heat spreader 118 to the second IC die 104 may be controlled independently of force applied by the first heat spreader 116 to the first IC die 102. This allows the force loads applied to different dies within the chip package 100 to be separately controlled, thus enabling electrical and thermal contact to be separately optimized for different IC dies of the chip package 100.

A plurality of second biasing devices 126 engage the second heat spreader 118 to urge the second heat spreader 118 against the second IC die 104, thus promoting good heat transfer therebetween. In one example, each of the second biasing devices 126 include a spring 174 captured on a threaded fastener 176. The fastener 176 passes through a hole 172 formed in the second heat spreader 118. Below the second heat spreader 118, the male threaded portion of the fastener 176 engages a female threaded hole of formed in the first heat spreader 116 (as later described with reference to FIG. 4). The spring 174 is captured on the threaded fastener 176 between a head of the threaded fastener 176 and the second heat spreader 118. Thus, as the fastener 176 is screwed further into the threaded hole of the first heat spreader 116, the spring 174 applies an increasingly stronger force against the second heat spreader 118, thus urging the second heat spreader 118 against the second IC die 104. Conversely, as the fastener 176 is unscrewed from the threaded hole of the first heat spreader 116, the spring 174 applies increasingly less force against the second heat spreader 118, thus reducing the force applied by the second heat spreader 118 against the second IC die 104. Accordingly, the force applied by the second biasing devices 126 to the second IC die 104 may be controlled independently from the force applied by the first biasing devices 126 to the to the first IC die 102. Beneficially, the force applied to both the first IC die 102 by the first heat spreader 116 and to the socket 120 by the chip package 100 can be controlled independently of the force applied by the second heat spreader 118 to the second IC die 104, which allows for a wider variety of IC dies to be utilized in the chip package 100 while maintaining robust thermal management of the IC dies without sacrificing the reliability of the electrical connection between the chip package 100 and socket 120, or creating an imbalance of force that could promote warpage of the package substrate 128 and consequently poor reliability of the electrical connections between the components of the chip package 100.

The second heat spreader 118 is much smaller than the first heat spreader 116. For example, the second heat spreader 118 may have a planar surface area that is 2 or more times smaller than the first heat spreader 116. As the second heat spreader 118 is much smaller than the first heat spreader 116, a passive fluid carrier (such as a heat pipe 122) may be utilized to promote heat transfer from the second heat spreader 118 to a region of the first heat spreader 116 away from the first IC die 102 where the heat may be more effectively transferred to the thermal management device 140. As the second heat spreader 118 is movable relative to the first heat spreader 116, the heat pipe 122 has a flexible construction that does not significantly impede the relative motion between the heat spreaders 116, 118. Alternatively, a more rigid heat pipe 122 may be utilized that is connected to the heat spreaders 116, 118 in a manner that not significantly impede the relative motion between the heat spreaders 116, 118.

The heat pipe 122 is generally a two phase passive fluid carrier that has a complete mechanical bond to heat spreaders 116, 118 to ensure adequate thermal contact between the heat spreaders and the passive fluid carrier. The passive fluid carrier transfers heat lost from the IC dies in contact with heat spreaders. The heat pipe 122 contacts the second heat spreader 118 via clip 132. The clip 132 allows partial movement of the heat pipe 122 relative to the second heat spreader 118 during assembly and to account for mechanical tolerances.

The heat pipe 122 is also rests on a groove 134 formed in the second heat spreader 118. Optionally, the first heat spreader 116 may also include a groove 162 for receiving the heat pipe 122. In one example, the heat pipe 122 rests in the groove 134 with no any means of attachment to the second heat spreader 118 other than the clip 132 to allow partial movement during assembly to during assembly and to account for mechanical tolerances. Alternatively, the heat pipe 122 may include a secured region 188 that solders, brazes, bonds or otherwise attaches the heat pipe 122 mechanically in good thermal contact with the second heat spreader 118.

In the example depicted in FIG. 1, a first end 154 of the heat pipe 122 is disposed under or adjacent the thermal management device 140 and includes a first secured region 184 that soldered, brazed, epoxied, or otherwise fastened to the first heat spreader 116. The first secured region 184 of the heat pipe 122 ends at an edge of the first heat spreader 116, or as illustrated in FIG. 1, is set back from the edge of the first heat spreader 116 such that an unsecured region 186 of the heat pipe 122 is disposed over the first heat spreader 116. In one example, the first secured region 184 of the heat pipe 122 is affixed in the groove 162 formed in the first heat spreader 116. The heat pipe 122 extends from the edge of the first heat spreader 116 across a gap 178 defined between the edge of the first heat spreader 116 and the adjacent edge of the second heat spreader 118. The heat pipe 122 includes a second secured region 188 that soldered, brazed, epoxied, or otherwise fastened to the second heat spreader 118. The unsecured region 186 of the heat pipe 122 also may extend across the gap 178 and optionally over a portion of the adjacent region of the second heat spreader 118. The unsecured region 186 of the heat pipe 122 allows the heat pipe 122 to flex or otherwise allow the movement of the second heat spreader 118 relative to the first heat spreader 116, such that the force applied to the second heat spreader 118 to urge the second heat spreader 118 against the second IC die 104 may be set independently from the force urging the first heat spreader 116 against the first IC die 102.

As introduced above, the second heat spreader 118 may include a groove 134 that has a sectional profile that is complimentary to the sectional profile of the heat pipe 122. As such, the heat pipe 122 may be in close contact with the groove 134. The complimentary sectional profiles of the heat pipe 122 and groove 134 results in greater surface contact area of the heat pipe 122 with the second heat spreader 118. Accordingly, the second heat spreader 118 more efficiently transfer heat to the heat pipe 122. In one example, the complimentary sectional profiles of the heat pipe 122 and groove 134 may be an arc segment, a semi-circle, a flatten oval or other suitable shape.

A clip 132 may be optionally utilized to hold the heat pipe 122 adjacent to the second heat spreader 118. The clip 132 may be configured as a strap that captures the heat pipe 122 in the groove 134 of the second heat spreader 118. Optionally, the clip 132 may be configured to allow the heat pipe 122 to move axially relative to the second heat spreader 118 such that as the second heat spreader 118 moves relative to the first heat spreader 116, the heat pipe 122 may move slightly through the clip 132. The clip 132 may additionally or alternatively be configured to allow the heat pipe 122 to move laterally relative to the second heat spreader 118 to allow the heat pipe 122 to move more freely and thus not hinder the movement of the second heat spreader 118 relative to the first heat spreader 116. In one example, the clip 132 is coupled to one of the stiffener 114, the first heat spreader 116 or the second heat spreader 118.

Figure 2:
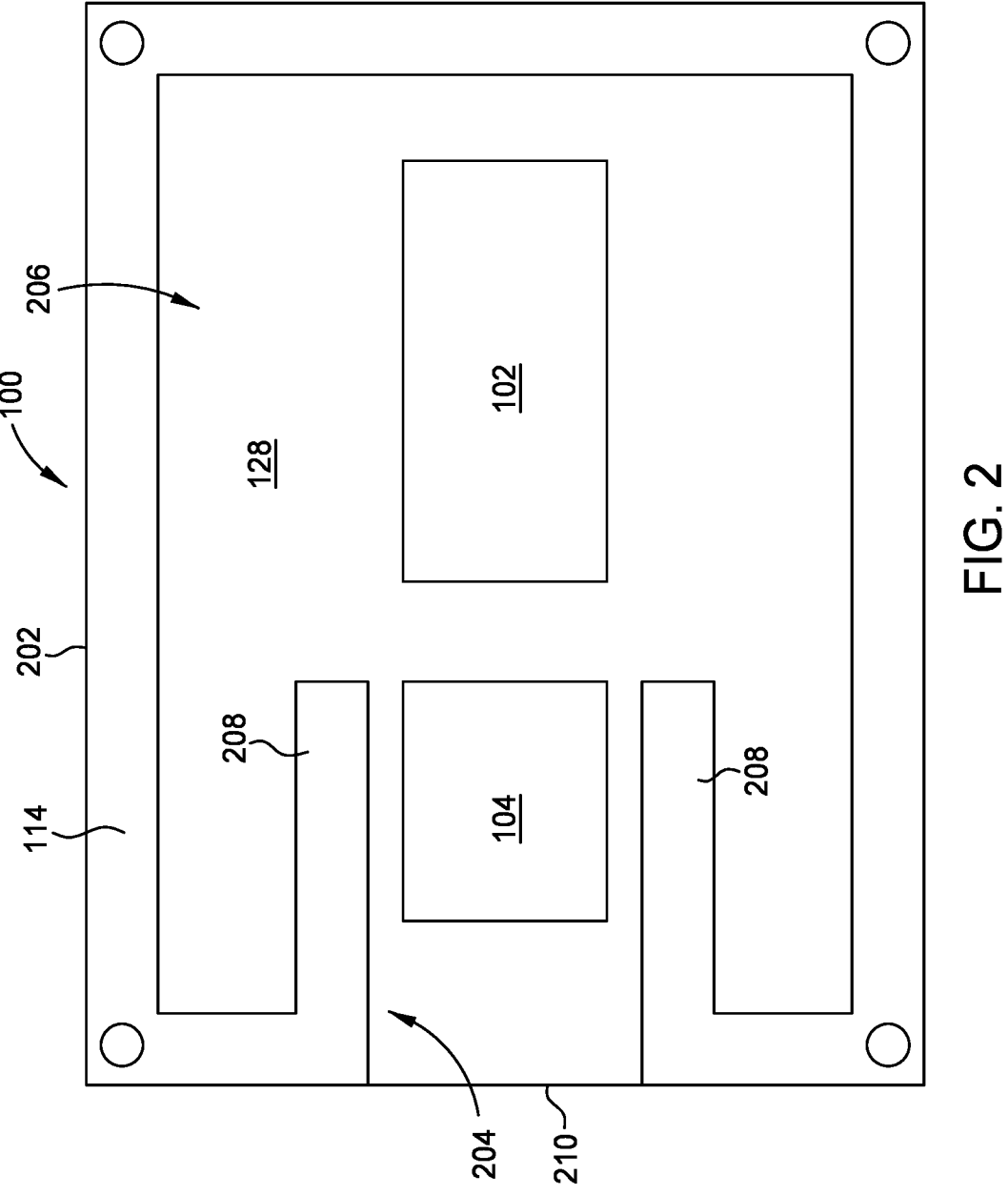
FIG. 2 is a schematic top view of the chip package of FIG. 1 with the heat spreaders removed revealing the first and second IC dies disposed on a package substrate.

FIG. 2 is a schematic top view of the chip package 100 of FIG. 1 with the heat spreaders (116, 118) removed revealing the first and second IC dies 102, 104 disposed on the package substrate 128. As shown in FIG. 2, the stiffener 114 is disposed around a perimeter 202 of the package substrate 128. In one example, the stiffener 114 includes at least one notch 204. The notch 204 extends through the stiffener 114 such that the stiffener 114 forms a "c-shaped" ring. In other examples, stiffener 114 includes at least two notches 204, such as one notch on different edges of the package substrate 128.

The first IC die 102 is disposed on an interior region 206 of the package substrate 128 that is circumscribed by the stiffener 114. As such, the first IC die 102 is also circumscribed by the stiffener 114. The first IC die 102 is disposed on the package substrate 128 adjacent the second IC 104 and the notch 204. Optionally, one or more additional IC dies may be disposed in the interior region 206 of the package substrate 128. In one example, the stiffener 114 optionally includes legs 208 that extend inward from an edge 210 of the package substrate 128 into the interior region 206 on either side of the second IC die 104.

Figure 3:
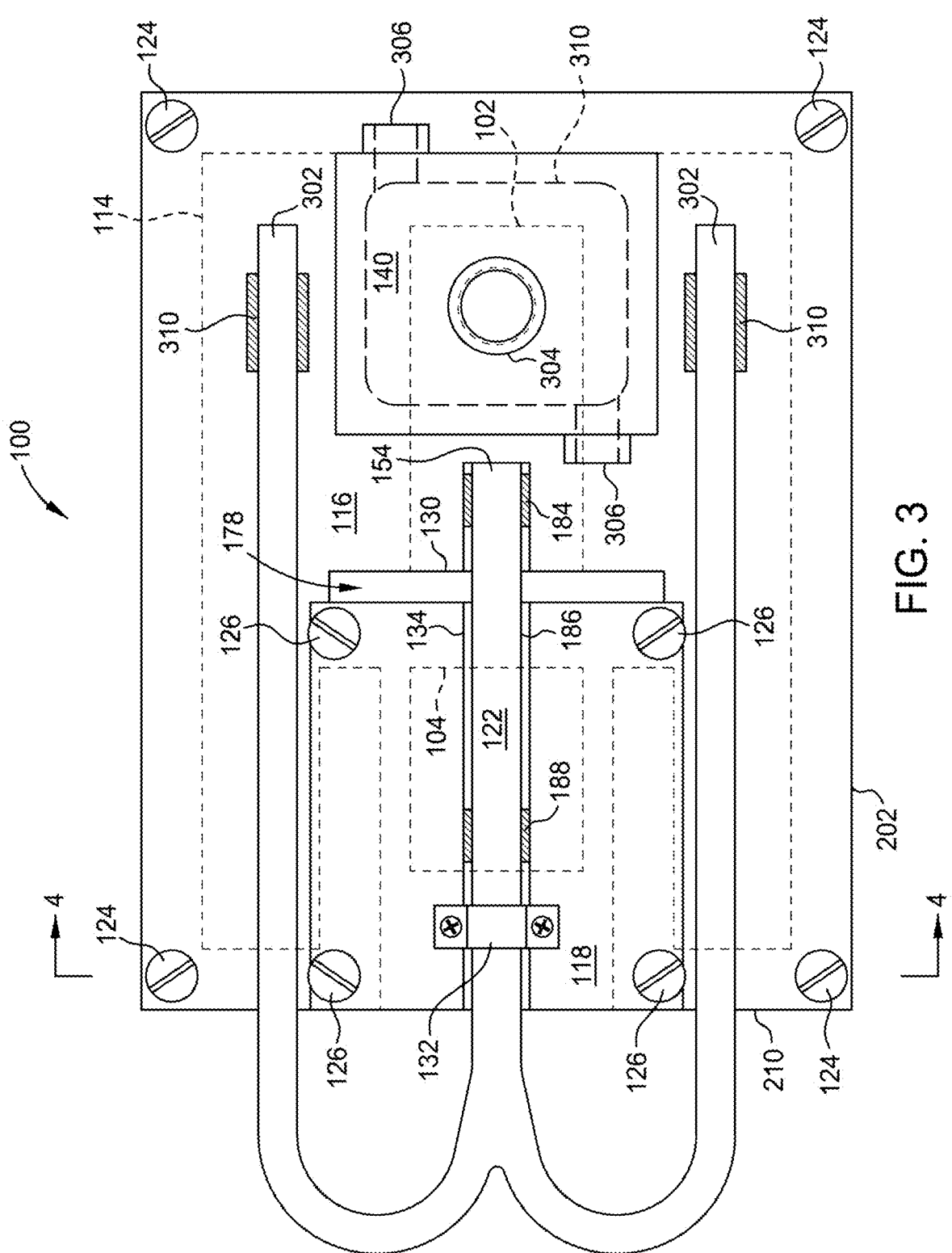
FIG. 3 is a schematic top view of the chip package of FIG. 1 illustrating the second heat spreader nested within the first heat spreader.

FIG. 3 is a schematic top view of the chip package 100 of FIG. 1 illustrating the second heat spreader 118 nested within the first heat spreader 116. The first heat spreader 116 may be similar in size to the package substrate 128. The opening 130 of the first heat spreader 116 is generally aligned with the notch 204 formed in the stiffener 114. The second heat spreader 118 is disposed in the opening 130 of the first heat spreader 116. The gap 178 between the first and second heat spreaders 116, 118 allows the second heat spreader 118 to more relative to the first heat spreader 116.

The first biasing devices 124 are located around the edges of the first heat spreader 116. In the example depicted in FIG. 3, four first biasing devices 124 are located one in each corner of the first heat spreader 116.

The second biasing device 126 are located around the edges of the second heat spreader 118. In the example depicted in FIG. 3, four first biasing devices 124 are located one in each corner of the second heat spreader 118.

Figure 4:
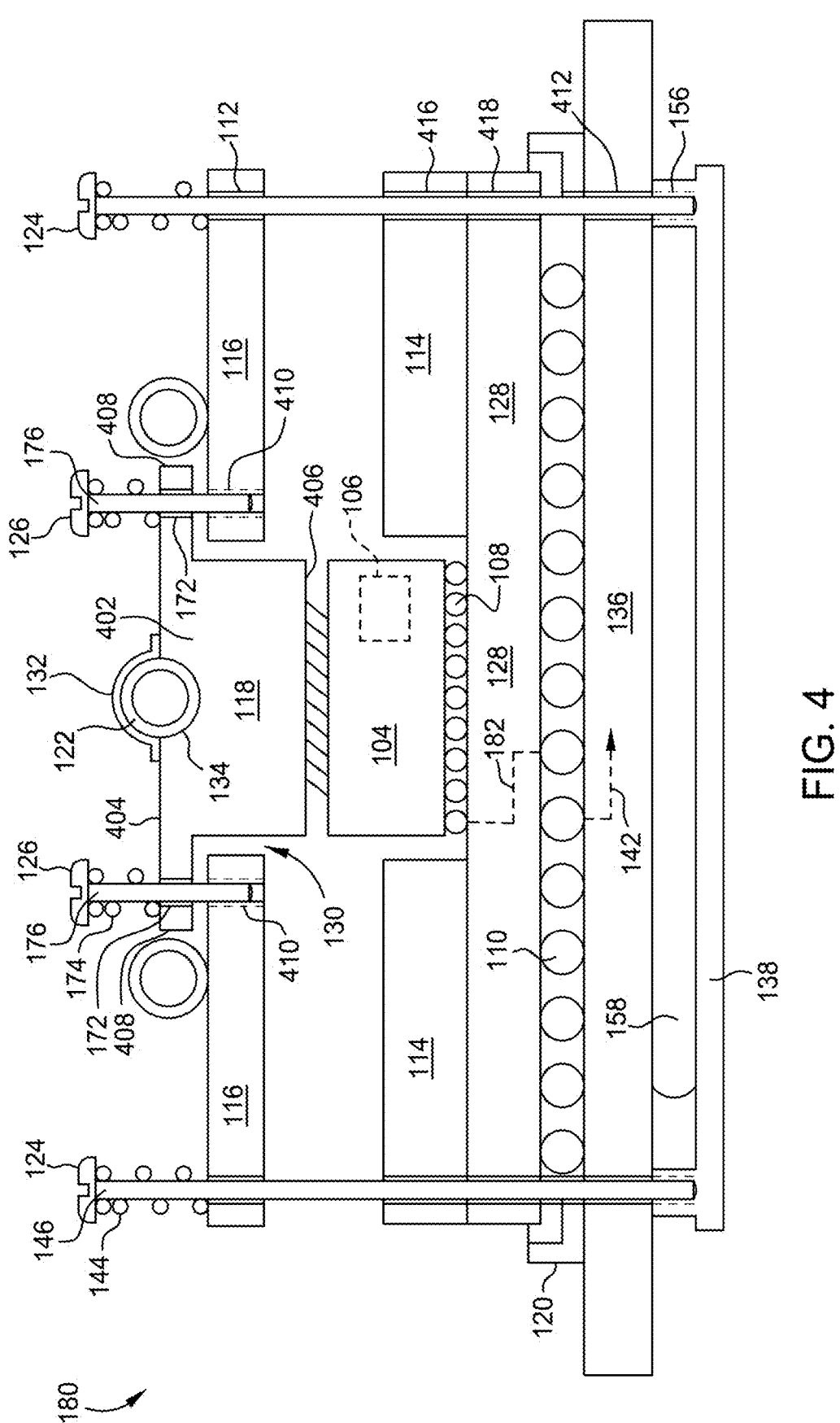
FIG. 4 is a schematic sectional view of the chip package of FIG. 1 taken along section line 4-4 depicted in FIG. 3.

FIG. 4 is a partial sectional view providing additional details of the interface between the first and second heat spreaders 116, 118. The second heat spreader 118 includes a body 402 that has a top surface 404 and a bottom surface 406. The body 402 extends through and freely moves with the opening 130 of the first heat spreader 116. The body 402 extends below the first heat spreader 116 such that the bottom surface 406 of the body 402 can contact the second IC die 104.

The top surface 404 of the body 402 includes two flanges 408. The flanges 408 extend from the body 402 beyond the edges of the opening 130 and overlap the first heat spreader 116. The holes 172 of the second heat spreader 118 that accept the threaded fastener 176 of the second biasing devices 126 are formed in the two flanges 408, and are aligned with a female threaded hole 410 of formed in the first heat spreader 116. Similarly, the threaded fastener 146 of the first biasing devices 124 passes through the hole 112 formed in the first heat spreader 116 and through a hole 412 formed in the PCB 136, and engages the female threaded hole 156 formed in the retainer 138.

In the example depicted in FIG. 4, both the first IC die 102 and the second IC dies 104 are shown electrically coupled to the package substrate 128 utilizing solder interconnects 108. However, one or more of the IC dies 102, 104 may be electrically coupled to the package substrate 128 utilizing alternative techniques. For example, one or more of the IC dies 102, 104 may be electrically coupled to the package substrate 128 utilizing a socket.

Figure 5:
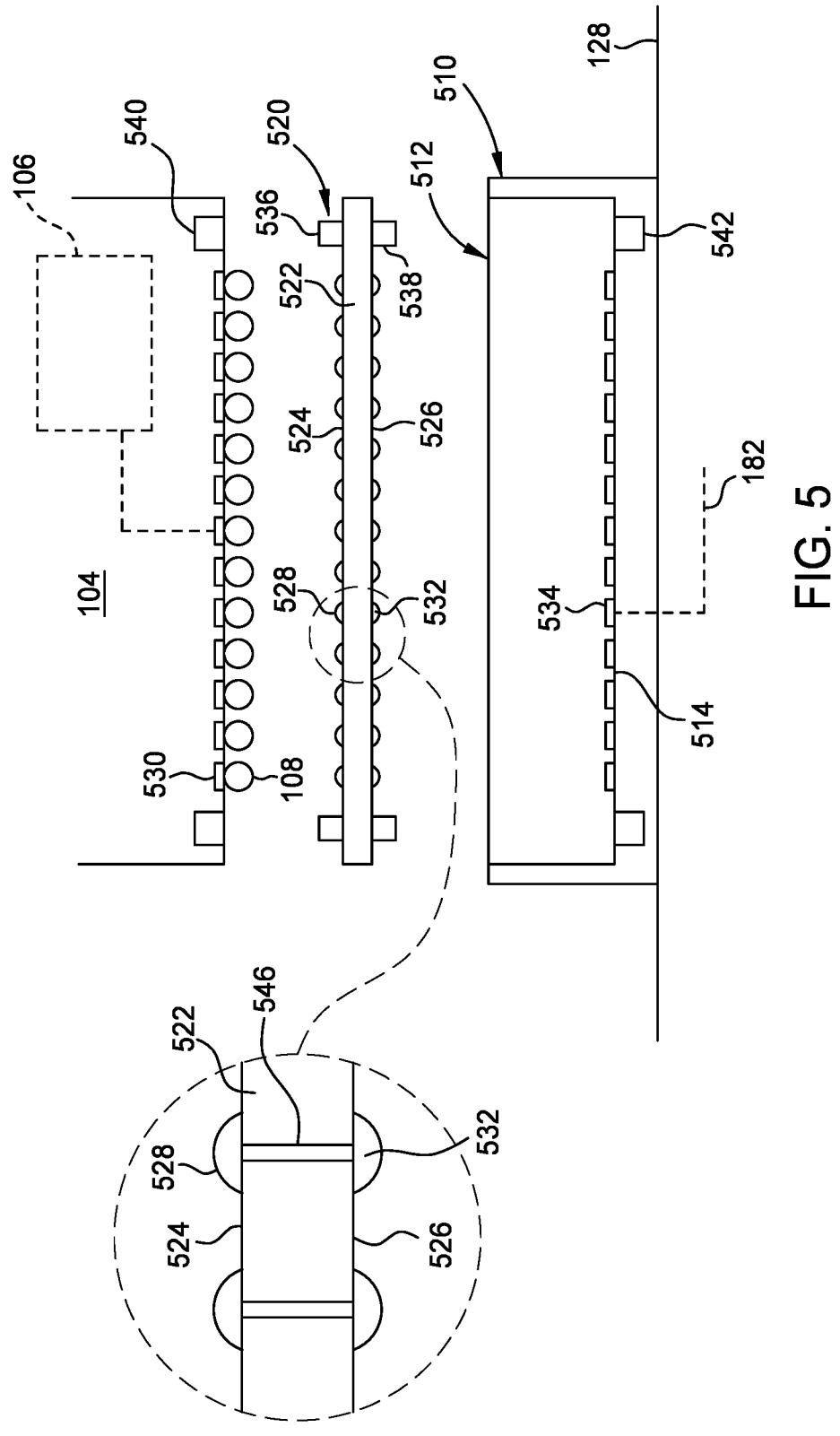
FIG. 5 is a schematic sectional exploded view of a portion the chip package of FIG. 1 illustrating an optional socket utilized to mount an IC die to a package substrate.

FIG. 5 is a sectional view of an alternative technique for electrically connecting the second IC die 104 to the package substrate 128 utilizing a socket 510. The same technique may be optionally be utilized to connect the first IC die 102 or other IC die of the chip package 100 to the package substrate 128.

As shown in FIG. 5, the socket 510 is surface mounted to the package substrate 128. The socket 510 includes a die receiving pocket 512 configured to receive the second IC die 104. A bottom surface 514 of the die receiving pocket 512 includes a plurality of electrical contacts 534 that are connected to the circuitry 182 of the package substrate 128.

A jumper frame 520 is disposed between the socket 510 and the second IC dies 104. The jumper frame 520 includes a substantially planar jumper substrate 522 having a top surface 524 and a bottom surface 526. The top surface 524 of the jumper frame 520 includes a plurality of contacts 528 that are arranged in a pattern complimentary to the solder interconnects 108 coupled to contact pads 530 formed on the bottom of the second IC die 104. The bottom surface 526 of the jumper frame 520 includes a plurality of contacts 532 that are arranged in a pattern complimentary to electrical contacts 534 exposed on the bottom surface 514 of the socket 510. The contacts 532 of the socket 510 are connected to the circuitry 182 of the package substrate 128, for example, via surface mounting, soldering, or other suitable technique.

The jumper substrate 522 is generally fabricated from a dielectric material, such as a substantially rigid polymer, ceramic, glass reinforced plastic or other suitable material. The jumper substrate 522 additionally includes a plurality of vias 546 that electrically connect the contacts 528, 532 that are exposed on the top and bottom surfaces 524, 526 of the jumper substrate 522.

The top and bottom surfaces 524, 526 of the jumper substrate 522 also include locating features. The locating features of the jumper substrate 522 are configured to engage complimentary locating features on the second IC die 104 and the socket 510 such that when the second IC die 104 is urged against the bottom surface 514 of the die receiving pocket 512, electrical connection is made between the contact pads 530 of the second IC die 104 with the contacts 534 of the socket 510 through the vias 546 and contacts 528, 532 of the jumper frame 520. In one example, the locating features and complimentary locating features are holes and pins, although other locating features may be utilized, such as mating geometry. In the example depicted in FIG. 5, the top surface 524 of the jumper frame 520 includes at least one or more locating pins 536 that are positioned to engage a complimentary locating hole 540 formed in a bottom surface of the second IC die 104. Similarly, the bottom surface 526 of the jumper frame 520 includes at least one or more locating pins 538 that are positioned to engage a complimentary locating hole 542 formed in the bottom surface 514 of the die receiving pocket 512. In one example, pins 536, 538 are located in the four corners of the jumper frame 520, although other configurations may be readily utilized. It is also contemplated that which components have the locating pins and holes may be reversed.

One advantage of utilizing a socket 510 to mount the second IC die 104 to the package substrate 128 is that the second IC die 104 is not exposed to high temperatures utilized to reflow solder connections, such as the solder interconnects 108 utilized to mount the first IC die 102 to the package substrate 128. Thus, if the second IC die 104 has temperature sensitive circuitry, construction and/or materials such as found in optical devices, the second IC die 104 may be mounted at ambient temperatures to socket 510 of the package substrate 128 after the first IC die 102 and the package substrate 128 have been exposed to high reflow temperatures, thereby protecting the temperature sensitive circuitry of the second IC die 104.

Returning to FIG. 4, the heat pipe 122 is illustrated extending from the second heat spreader 118 into the free space beyond the bounds of the chip package 100 and bending 180 degrees back towards the chip package 100, with a second end 302 of the heat pipe 122 terminating on the first heat spreader 116 adjacent the thermal management device 140 that is also mounted to the first heat spreader 116. In on example, the second end 302 of heat pipe 122 has a secured region 310 that is secured to the first heat spreader 116 by a clamp, solder, brazing, thermally conductive epoxy or other technique that promotes heat transfer between the heat pipe 122 and the first heat spreader 116. In this manner, the heat pipe 122 efficiently moves heat from the second heat spreader 118 to the first heat spreader 116, from where heat can be efficiently removed by the thermal management device 140. In some examples, a singular "hook-shaped" heat pipe 122 is used. In other examples, multiple first heat spreaders 116 may be used to more heat between the first and second heat spreaders 116, 118. For example, a twin separate "hook-shaped" heat pipe 122 are used. In the example depicted in FIG. 4, the heat pipe 122 is forked such that the heat pipe 122 has one first end 154 (shown in FIG. 1) that splits to form two or more second ends 302. Stated differently, the heat pipe 122 may have a "w-shape". The second ends 302 of the heat pipe 122 are coupled to the first heat spreader 116 on opposite sides of the thermal management device 140. The split heat pipe 122 further increases the rate of heat transfer from the second heat spreader 118 to the first heat spreader 116, which enhances thermal management, performance, and reliability of both IC dies 102, 104.

Although the thermal management device 140 as described above, may be an active and/or passive heat transfer device, in the example depicted in FIG. 5, the thermal management device 140 is an active device in the form of force fluid flow heat exchanger. The thermal management device 140 includes at least one inlet port 304 and at least one outlet port 306 that are fluidly connected in an internal cavity 308 (shown in phantom). The internal cavity 308 may include channels, fins and/or baffles, all not shown, for increasing at least one or both of the surface area available for heat transfer and the residence time of fluid within the thermal management device 140. In the example depicted in FIG. 4, the thermal management device 140 includes an inlet port 304 located on the top surface of the thermal management device 140 that faces away from the first heat spreader 116, and two outlet port 306, one disposed on either side of the thermal management device 140. Having the inlet port 304 located on the top surface of the thermal management device 140 saves space and simplifies routing of fluid conduits between the thermal management device 140 and a heat transfer fluid source, not shown. One example of a fluid circuit for providing heat transfer fluid to the active thermal management device 140 is provided further below with reference FIG. 10.

FIGS. 6A-D are schematic top views of simplified chip packages illustrating the two heat spreaders nested within the first heat spreader. In the examples of FIGS. 6A-D, the chip packages 100 are configured as described above, except for the location and number of the heat spreaders. In FIGS. 6A-D, each second heat spreader is paired with one or more IC dies, and each first heat spreader is paired with one or more IC dies that are not interfaced with the second heat spreader. The flanges of the second heat spreader have been omitted to better convey how a portion of the second heat spreader extends through the first heat spreader.

Figures 6A, 6B, 6C, 6D:
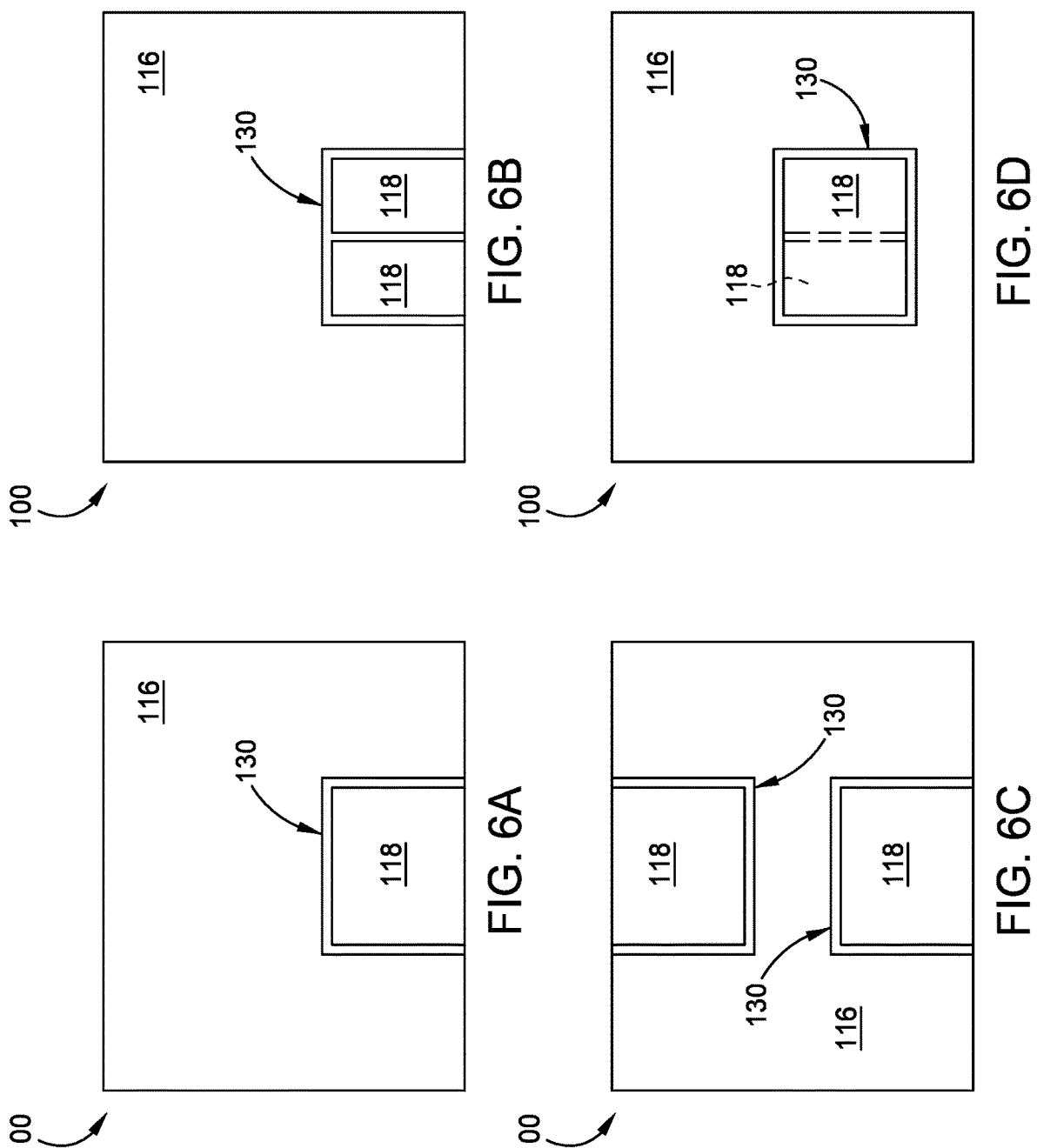
FIGS. 6A-6D are a schematic top views of chip packages illustrating the two heat spreaders nested within the first heat spreader.

In the example of FIG. 6A, the chip package 100 includes a first heat spreader 116 having an opening 130 in the form of a notch in the edge of the first heat spreader 116. The second heat spreader 118 is nested in the opening 130, and is configured to move freely in the notch to contact the underlying second IC die 104.

In the example of FIG. 6B, the chip package 100 includes a first heat spreader 116 having an opening 130 in the form of a notch. Two or more second heat spreaders 118 are nested in same the notch, and are configured to move freely in the notch to contact one or more underlying second IC dies 104.

In the example of FIG. 6C, the chip package 100 includes a first heat spreader 116 having two or more opening 130 in the form of a notch. Second heat spreaders 118 are respectively nested in the notches. Each second heat spreader 118 is configured to move freely in their notch to contact an underlying second IC die 104. The second heat spreaders 118 may reside on opposite sides of the chip package 100, or reside on adjacent sides of the chip package 100. One or more second heat spreaders 118 may be disposed in each of the openings 130.

In the example of FIG. 6D, the chip package 100 includes a first heat spreader 116 having an opening 130 in the form of a window that is completely surrounded by the first heat spreader 116. The second heat spreader 118 is nested in the opening 130, and is configured to move freely in the opening 130 to contact the underlying second IC die 104. Optionally, two or more second heat spreaders 118 may be disposed in each of the openings 130.

Figure 7:
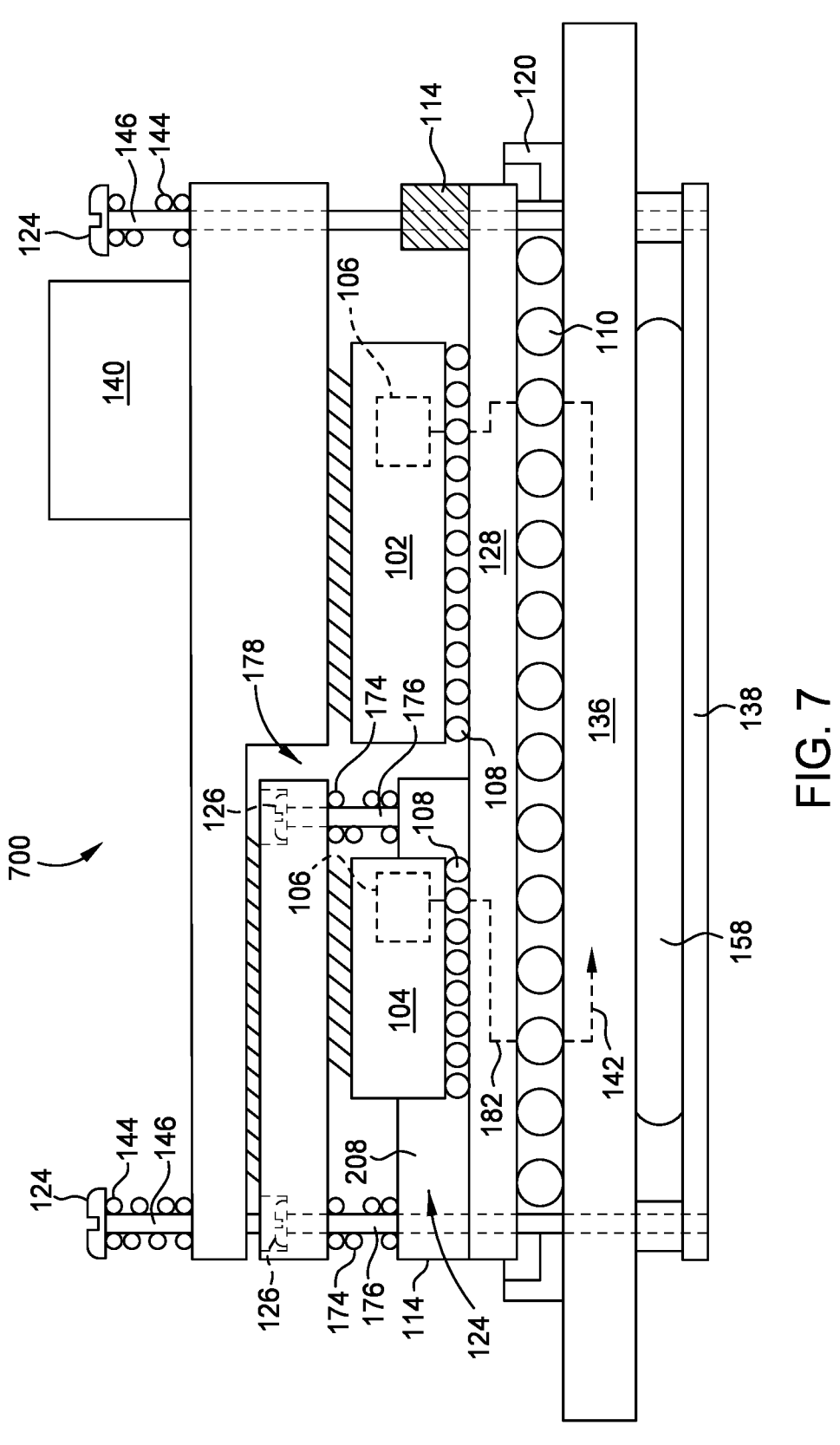
FIG. 7 is a schematic sectional view of another chip package having a first heat spreader interfaced with a first integrated circuit (IC) die and a second heat spreader separately interfaced with a second IC die, the IC dies mounted on a package substrate.

FIG. 7 is a schematic partial sectional view of another chip package 700 illustrating another configuration of a second heat spreader 118 nested within a first heat spreader 116. The chip package 700 may be coupled to a PCB 136 to form an electronic device 780 as described above. The components of the chip package 700 are generally identical to the chip package 100 describe above, and have been given the same reference numerals in FIG. 7. Additionally, the use of heat pipes 122 are optional, may be incorporated as described above or in another suitable manner. The primary difference between the chip package 700 and the chip package 100 is that the plurality of second biasing members 126 that bias the second heat spreader 118 against the second IC die 104 are threaded into female threaded holes 702 formed in the stiffener 114. The second heat spreader 118 may be nested within an opening 130 of the first heat spreader 116 as described above, or alternatively, the second heat spreader 118 may be nested between the first heat spreader 116 and the package substrate 128 as shown in FIG. 7, with the second heat spreader 118 disposed completely below the first heat spreader 116. Additionally, the chip package 700 may be configured as shown in any of the examples described with reference to FIGS. 6A-6D.

Figure 8:
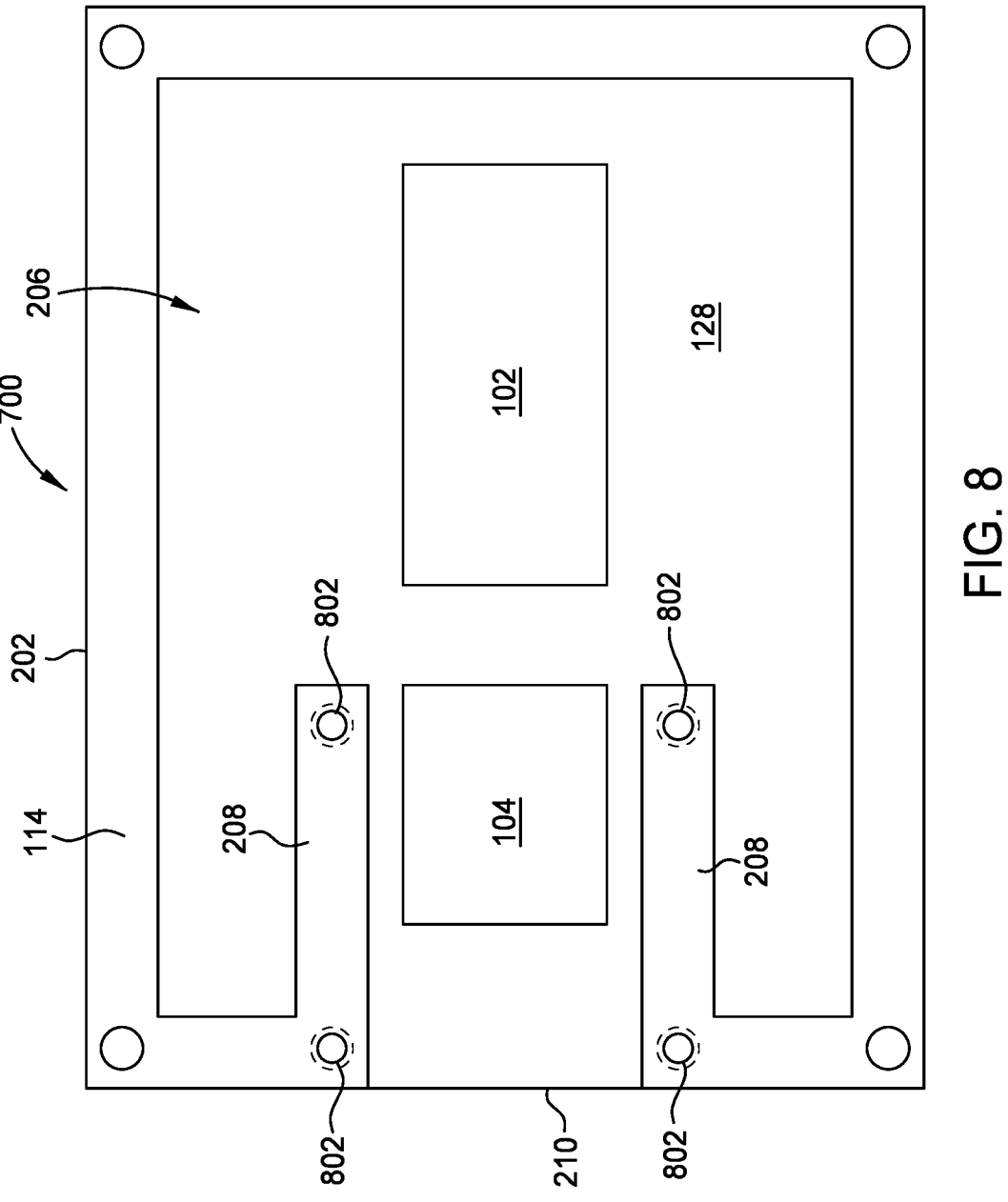
FIG. 8 is a schematic top view of the chip package of FIG. 7 with the heat spreaders removed revealing the first and second IC dies disposed on a package substrate.

FIG. 8 is a schematic top view of the chip package 700 of FIG. 7 with the heat spreaders (116, 118) removed revealing the first and second IC dies 102, 104 disposed on the package substrate 128. As shown in FIG. 8, the stiffener 114 is disposed around a perimeter 202 of the package substrate 128. In one example, the stiffener 114 includes at least one notch 204. The notch 204 extends through the stiffener 114 such that the stiffener 114 forms a "c-shaped" ring. In other examples, stiffener 114 includes at least two or more notches 204, such as one notch on different edges of the package substrate 128. As described with reference to FIGS. 6A-6D, the notches 204 (or alternatively windows) may accommodate one or more second IC dies 104 and may be interfaced with one or more second heat spreaders 118.

As discussed above, the first IC die 102 is disposed on an interior region 206 of the package substrate 128 that is circumscribed by the stiffener 114. As such, the first IC die 102 is also circumscribed by the stiffener 114. The first IC die 102 is disposed on the package substrate 128 adjacent the second IC die 104 and the notch 204. Optionally, one or more additional IC dies may be disposed in the interior region 206 of the package substrate 128.

On either side of the notch 204 of the stiffener 114, the stiffener 114 includes a pair of legs 208. The legs 208 typically are parallel to each other, and extend into the interior region 206 from the edge 210 to form the notch 204. The legs 208 typically have an orientation that is perpendicular to the adjacent side 804 of the stiffener 114. The legs 208 also include threaded holes 802 for receiving the threaded portion of the fastener 176 of the second biasing devices 126. As described above, the fastener 176 may be tightened (i.e., screwed into the threaded holes 802 of the stiffener 114) to increase the force generated by the spring 174 to bias the second heat spreader 118 against the second IC die 104, thus promoting good heat transfer therebetween. The spring 174 can also be disposed between the head of the fastener 746 and the top surface 404 of the second heat spreader 118. In another configuration, there can be 2 or more springs 174 which can have same or different spring constant (Newton/m). When more than 2 springs 174 are utilized, one or more of the springs 174 may be between the head of the fastener 746 and the top surface 404 of the second heat spreader 118, and one or more other springs 174 can be disposed between the bottom surface 406 of the second heat spreader 118 and stiffener 208.

Figure 9:
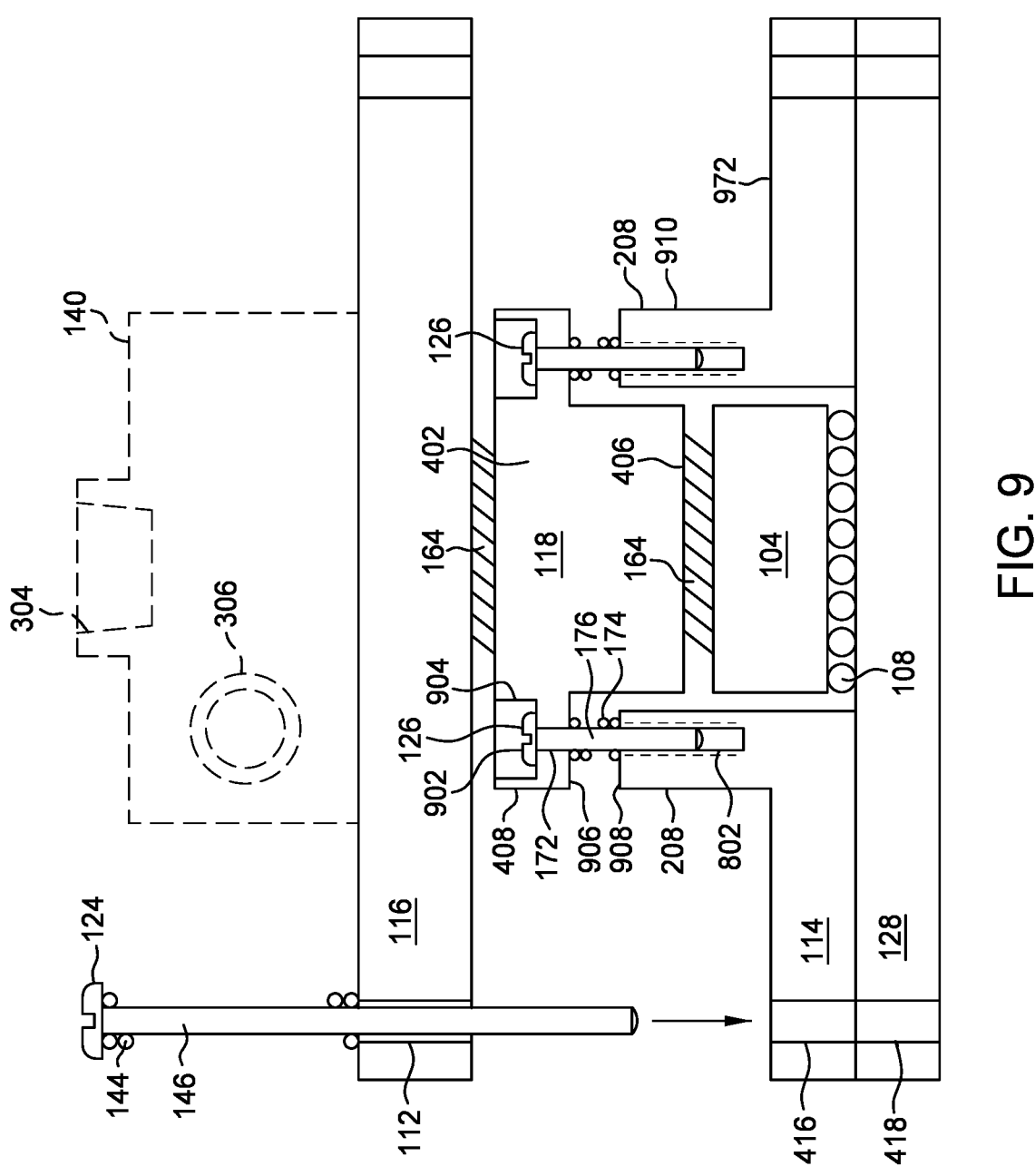
FIG. 9 is a partial sectional view of the chip package of FIG. 7 illustrating an interface between the second heat spreader and a stiffener.

FIG. 9 is a schematic sectional view of a portion of the chip package 700 of FIG. 7 illustrating the second heat spreader 118 nested below the first heat spreader 116. The second heat spreader 118 may alternatively be nested in an opening 130 of the first heat spreader 116 (as shown in FIGS. 6A-6D). The first heat spreader 116 may be similar in size to the package substrate 128 and is generally coupled to the retainer 138 as described above.

The second heat spreader 118 is disposed above the notch 204 of the stiffener 114. The flanges 408 of the second heat spreader 118 extend over the legs 208 of the stiffener 114 to allow the second biasing device 126 to be interfaced with the stiffener 114 rather than the first heat spreader 116. Each flange 408 of the second heat spreader 118 includes a counter bore 904 aligned with the through hole 172 passing through the second heat spreader 118. The counter bore 904 may be sized to completely receive a head 902 of the fastener 176 of the second biasing device 126, thus allowing the first heat spreader 116 to be substantially flush with the second heat spreader 118 to promote heat transfer therebetween. TIM 164 may be disposed between the heat spreader 116, 118 to further enhance heat transfer.

The threaded end of the fastener 176 engages the threaded hole 802 formed in the legs 208 of the stiffener 114. A portion 910 of the legs 208 may project farther from the package substrate 128 to allow a deeper threaded hole 802. The spring 174 is captured on the fastener 176 between a bottom surface 906 of the flange 408 and a top surface 908 of the legs 208, thus allowing the force exerted by the second heat spreader 118 on the second IC die 104 to be readily controlled.

Figure 10:
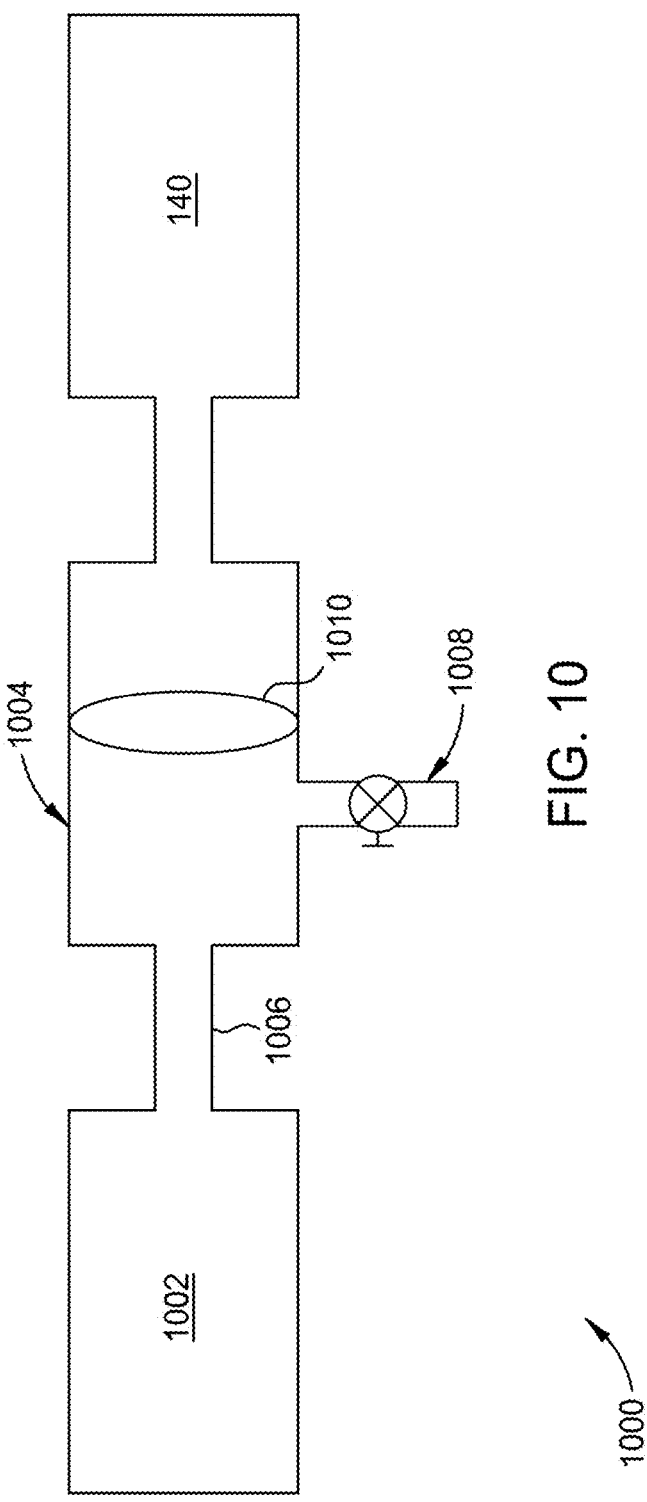
FIG. 10 is a schematic flow diagram of a fluid circuit for providing heat transfer fluid to an active thermal management device of a chip package.

FIG. 10 is a schematic flow diagram of a fluid circuit 1000 for providing heat transfer fluid to an active thermal management device 140 of a chip package, such as the chip package 100, 700, or other chip package. The fluid circuit 1000 includes a heat transfer fluid source 1002 coupled though a particle trap 1004 to the thermal management device 140. The particle trap 1004 is configured to remove particles from the heat transfer fluid prior to entering the thermal management device 140, which increases the life and heat transfer efficiency of the thermal management device 140.

The particle trap 1004 may be a trap that settles out particles from the fluid stream passing therethrough, may be a filter, or may be both a trap and a filter. In the example depicted in FIG. 10, the particle trap 1004 has a diameter greater than the conduit 1006 coupling the particle trap 1004 to the fluid source 1002. In one example, the particle trap 1004 has a diameter that is at least two times greater than a diameter of the conduit 1006 coupling the particle trap 1004 to the fluid source 1002. The increase in diameter within the particle trap 1004 slows the velocity of the fluid entering the trap 1004 to allow particle entrained in the slowing fluid to fall out of the fluid stream into the bottom of the trap 1004. The trap 1004 may include a drain 1008 that may be periodically opened to remove captured particles from the trap 1004. Alternatively or additionally, the trap 1004 may include a filter element 1010. The filter element 1010 may be a porous membrane, perforated material, a screen, a mesh, synthetic filter media, or other type of filter material.

Figures 11A, 11B, 11C, 11D:
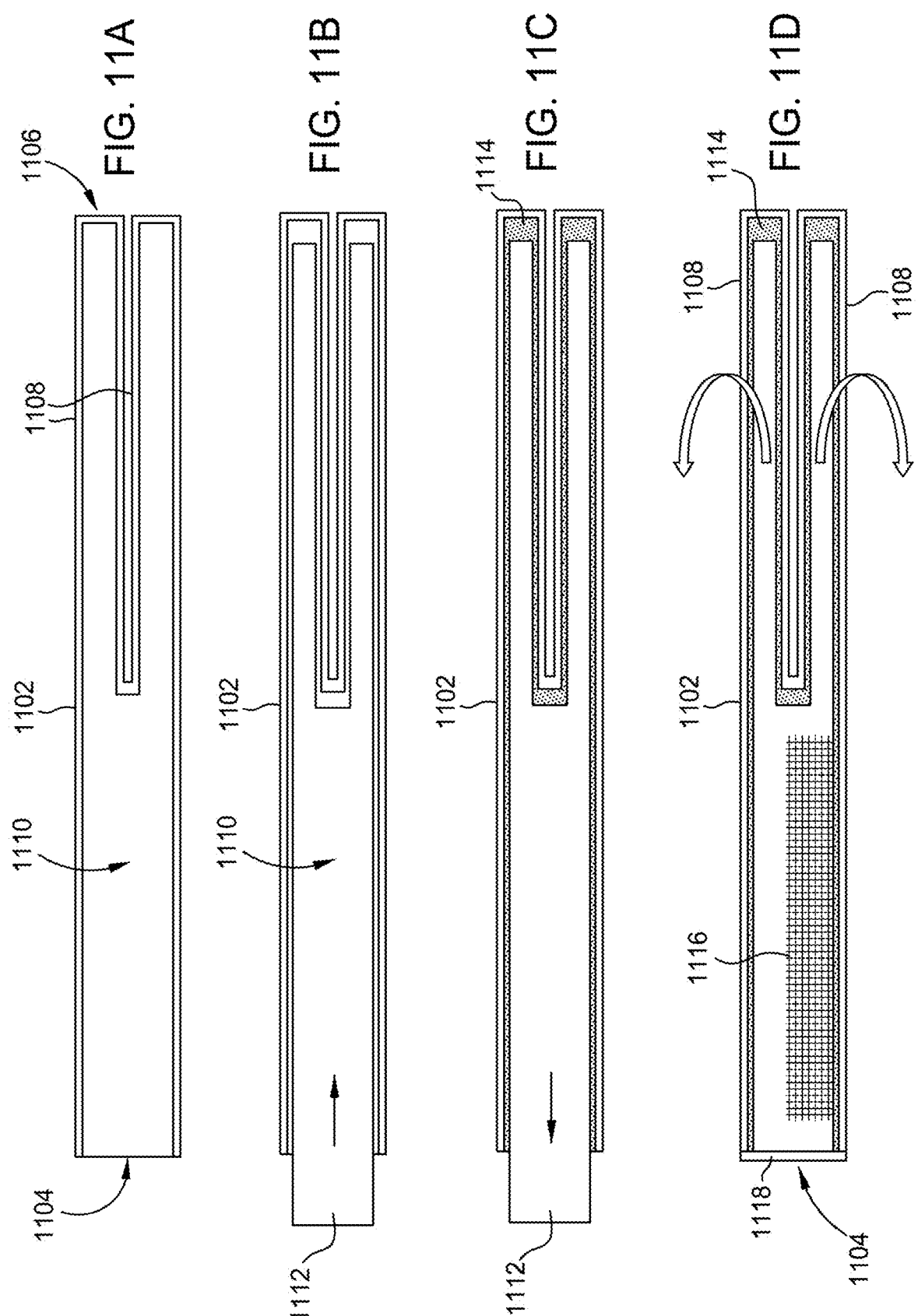
FIGS. 11A-11D are schematic illustrations of a forked heat pipe during different stages of fabrication.

FIGS. 11A-11D are schematic illustrations of a forked heat pipe during different stages of fabrication which may be utilized to make the heat pipe 122 described above, along with other heat pipe configurations. As illustrated in FIG. 11A, a shell 1102 is fabricated that includes a base end 1104 and a forked end 1106. In FIG. 11A, two forks 1108 are shown comprising the forked end 1106, but other numbers of forks 1108 may be formed. The ends of the forks 1108 are sealingly capped. The shell 1102 is fabricated from a material having good thermal conductivity that is also bendable. In one example, the shell 1102 is a metal, such as aluminum or stainless steel. The shell 1102 may be formed by casting, assembled from joined individual tubes, 3D printed or made via another suitable technique. The shell 1102 has a hollow interior 1110.

As illustrated in FIG. 11B, a form 1112 is inserted into the hollow interior 1110 of the shell 1102. The form 1112 is smaller than the shell 1102, such that a gap 1114 is formed between the form 1112 and the shell 1102.

As illustrated in FIG. 11C, metal powder 1114 is inserted into gap 1114 formed between the form 1112 and the shell 1102. The metal powder 1114 may be copper or other suitable material. The metal powder 1114 is subsequently sintered, leaving the sintered metal powder 1114 lining the interior surface of the shell 1102, as shown in FIG. 11D.

As illustrated in FIG. 11D, the form 1112 removed from the shell 1102 and a phase change material 1116, such as liquid gallium or other suitable material, is disposed in the hollow interior 1110 of the shell 1102. After the phase change material 1116 is added, the base end 1104 is sealed with a cap 1118.

As illustrated in FIG. 11D, the forks 1108 comprising the forked end 1106 of the shell 1102 are bent, for example around a mandril, about 180 degrees to form a hook-shape. It is contemplated that one or more of the forks 1108 may be bent or shaped into a different angle or geometry. In one example, each fork 1108 is bent about 180 degrees in the opposite direction to form a W-shaped heat pipe 122, as shown in FIG. 3.

Thus, chip packages and methods for fabricating the same have been provided which utilize a first heat spreader interfaced with a first integrated circuit (IC) die and a second heat spreader separately interfaced with a second IC die. The separate heat spreaders allow the force applied to the first IC die to be controlled independent of the force applied to the second IC die. Since the force applied to each of the first and second IC dies is set independent of the other, good electrical contacts and robust thermal management of the IC dies within the chip package is realized. Moreover, in some embodiments, the use of a socket within the chip package allows dies having low temperature tolerance to be mounted to the package substrate after reflow of the other dies of the chip package, resulting in reduced potential for heat damage to low temperature tolerance dies, such as dies having optical devices. Accordingly, chip packages fabricated in accordance with the techniques described herein have longer service life, improved reliability and excellent performance.

While the foregoing is directed to embodiments of the present invention, other and further embodiments of the invention may be devised without departing from the basic scope thereof, and the scope thereof is determined by the claims that follow.

What is claimed is:

1. An electronic device comprising:
a package substrate;
a stiffener mounted to the package substrate;
a first IC die having a first surface and a second surface facing away from the first surface, the second surface of the first IC die facing the package substrate;
a second IC die having a first surface and a second surface, the second surface of the second IC die facing the package substrate;

a first heat spreader having a first surface and a second surface, the first surface of the first heat spreader having a die contact region configured for contacting the first surface of the first IC die, first heat spreader having an opening;

a second heat spreader having a first surface and a second surface, the second heat spreader movably disposed in the opening of the first heat spreader, the second heat spreader spaced from the first heat spreader by a gap defining a portion of the opening; and a flexible heat pipe in thermal contact with the first heat spreader and the second heat spreader, the heat pipe movable with the second heat spreader relative to the first heat spreader, the heat pipe having a phase change material disposed therein.

2. The electronic device of claim 1, wherein the heat pipe has a first end fixed to the first heat spreader.

3. The electronic device of claim 2, wherein the heat pipe is disposed in a groove formed in the first surface of the second heat spreader.

4. The electronic device of claim 2, wherein the heat pipe is retained by a clip over the second heat spreader.

5. The electronic device of claim 4, wherein the heat pipe is movable within the clip.

6. The electronic device of claim 2, wherein the heat pipe is fixed to the second heat spreader, wherein a least a portion of the heat pipe on at least one side of the gap is free of the heat spreader in a manner that allows the second heat spreader to move relative to the first heat spreader.

7. The electronic device of claim 1 further comprising:

a plurality of second springs biasing the second heat spreader to move relative to the first heat spreader.

8. The electronic device of claim 7 further comprising:

a plurality of first springs biasing the first heat spreader to move in a direction in which the second heat spreader is urged relative to the first heat spreader by the plurality of second springs.

9. The electronic device of claim 2, wherein the second IC die is a photonics die.

10. The electronic device of claim 1, wherein opening is U-shaped.

11. The electronic device of claim 1, wherein opening is bounded on four sides by the first heat spreader.

12. The electronic device of claim 1, wherein the heat pipe has a first end fixed to the second heat spreader.

13. The electronic device of claim 12, wherein the heat pipe has a second end fixed to the first heat spreader.

14. The electronic device of claim 12, wherein the heat pipe has a fork terminating at a second end and a third end, the second and third forked ends of the heat pipe are fixed to the first heat spreader.

15. The electronic device of claim 14 further comprising:

an active heat transfer device interfaced to the first heat spreader between the second and third forked ends of the heat pipe.

16. The electronic device of claim 1 further comprising:

an interposer having the first IC die mounted thereto, the interposer mechanically and electrically connected to the package substrate.

* * * * *